(12) United States Patent
Olivera Brizzio

(10) Patent No.: US 10,312,610 B1
(45) Date of Patent: Jun. 4, 2019

(54) OPTIMALLY INTERCONNECTABLE TERMINAL MATRIX WITH CIRCUIT IDENTIFICATION

(71) Applicant: Pablo Oscar Olivera Brizzio, Abu Dhabi (AE)

(72) Inventor: Pablo Oscar Olivera Brizzio, Abu Dhabi (AE)

( * ) Notice: Subject to any disclaimer, the term of this patent is extended or adjusted under 35 U.S.C. 154(b) by 0 days.

(21) Appl. No.: 16/107,675

(22) Filed: Aug. 21, 2018

(51) Int. Cl.
*H01R 12/58* (2011.01)
*H05K 1/02* (2006.01)

(52) U.S. Cl.
CPC ......... *H01R 12/585* (2013.01); *H05K 1/0268* (2013.01)

(58) Field of Classification Search
CPC .............................. H01R 12/585; H05K 1/0268
USPC ................................................. 361/759, 777
See application file for complete search history.

(56) References Cited

U.S. PATENT DOCUMENTS

2012/0275111 A1* 11/2012 Li .............................. G06F 1/18
361/679.57

\* cited by examiner

*Primary Examiner* — Sherman Ng
(74) *Attorney, Agent, or Firm* — Intellent Patents LLC; Ahmed Alhafidh

(57) ABSTRACT

Disclosed is an apparatus for optimally interconnecting a plurality of N electrical endpoints. The apparatus comprises a substrate having a number of terminals equal to at least the number required to short one or more unique pairs of the N endpoints. For example, to enable all combinations of two endpoints to be made between N endpoints, the apparatus comprises $N(N-1)/2$ terminals. Each terminal comprises a first contact coupled to a first endpoint and a second contact coupled to a second endpoint. The first contact and second contact of any terminal can be shorted to connect their corresponding endpoints. The terminals may be disposed on any side of the substrate.

3 Claims, 8 Drawing Sheets

OPTIMALLY INTERCONNECTABLE TERMINAL MATRIX WITH CIRCUIT IDENTIFICATION

CLAIM OF PRIORITY

This application is a continuation patent application of U.S. patent application Ser. No. 15/610,364 filed May 31, 2017 and titled 'OPTIMALLY INTERCONNECTABLE TERMINAL MATRIX WITH CIRCUIT IDENTIFICATION,' which claims priority to U.S. Provisional Patent Application Ser. No. 62/343,654, filed May 31, 2016, the entire disclosures of which are hereby expressly incorporated by reference herein.

FIELD OF TECHNOLOGY

This disclosure relates generally to electrical terminal blocks and, more particularly, to an optimally interconnectable terminal matrix needing no external wiring and additionally providing circuit identification.

BACKGROUND

When using a terminal block or strip to interconnect wires or distribute power amongst several terminal points, external wires must be cut at the appropriate length and interconnected carefully so as to prevent short circuits and injury. The total time to complete this preparation process correlates exponentially with the number of endpoints that must be interconnected. In addition, this method is also prone to user error since the connections within the terminal block or strip can be difficult to interpret. Current solutions include terminal block jumpers, which are static endpoints that do not allow for complex interconnections between terminals.

Thus, there exists a need for a simple solution for interconnecting endpoints in a terminal block or on a PCB without the use of external wires while at the same time determining which endpoints are being shorted within the terminal block or PCB.

SUMMARY

In accordance with the foregoing objectives and others, an apparatus is provided, including various arrangements of circuit components on a substrate for optimally interconnecting endpoints through a matrix of terminals.

In one aspect, an apparatus for interconnecting a plurality of endpoints comprises a substrate. Disposed thereon are a number of terminals equal to the number of combinations of the plurality of endpoints. Each terminal comprises a first contact connected to a first endpoint of the plurality of endpoints, and a second contact connected to a second endpoint of the plurality of endpoints. When the first contact and the second contact are shorted, the corresponding endpoints are also shorted.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

The embodiments of this invention are illustrated by way of example and not limitation in the figures of the accompanying drawings, in which like references indicate similar elements and in which.

Figure 1:
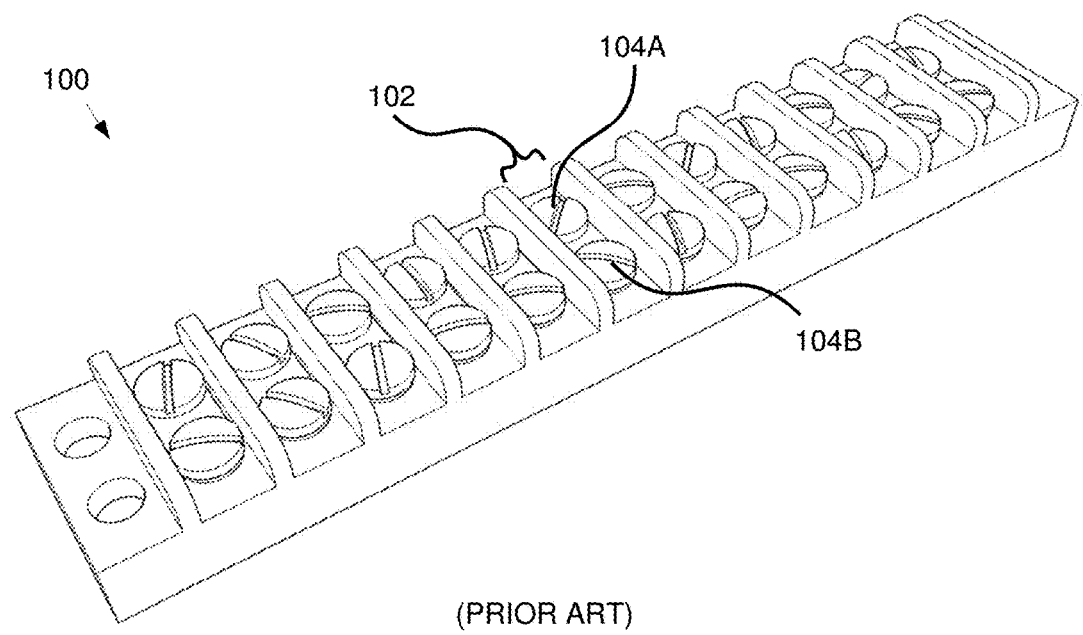
FIG. 1 shows an exemplary terminal block representative of the prior art.

Other features of the present embodiments will be apparent from the accompanying drawings and from the detailed description that follows.

DETAILED DESCRIPTION

Example embodiments, as described below, may be used to provide an optimally interconnectable terminal matrix for facilitating interconnections between endpoints without the use of external wires and additionally identifying which endpoints are interconnected.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Definitions

"Endpoints" refers to a source or sink of electrical power.

"Interconnection" refers to a closed circuit between two or more endpoints. For example, the number of two-endpoint combinations for N endpoints is:

$$\frac{N*(N-1)}{2} \tag{Equation 1}$$

"Terminal block" or "terminal strip" refers to any device or substrate that facilitates interconnections between a plurality of endpoints. A typical substrate may be a printed circuit board having printed traces and electrical components disposed thereon. For example, the endpoints may be coupled to one more conductive connectors disposed on the substrate.

"Terminal" refers to a location on a terminal block comprising at least a plurality of contacts each connected to one or more endpoints. The terminal allows for any combination of the plurality of contacts, and subsequently the endpoints connected thereto, to be temporarily or permanently short-circuited. An "activated terminal" is one in which the contacts thereof have been short-circuited.

"Matrix" refers to a multi-dimensional array of terminals. The matrix may be arranged in any physical configuration such that the terminals allow for any combination of the plurality of endpoints to be short circuited. In a preferred embodiment, a physical configuration for a terminal block allowing for optimal interconnections between endpoints provides for each endpoint to be coupled to the substrate at one connector and subsequently to one contact of the endpoint's corresponding terminals. Though the physical configuration can be modified to provide for added features and integration of more advanced components, the above preferred embodiment reduces overall manufacturing costs, facilitates prototyping, responds well to scaling, and is easily reconfigurable. Multiple endpoints may be short-circuited at a time for example by activating multiple terminals with overlapping endpoints.

When applied to a PCB, a matrix allowing for two endpoints to be connected at each terminal may be arranged as rows and columns of terminals. Each row and each column may conduct electricity between the terminals and connectors thereof "Vector" refers to a single row or single column having a set of one or more terminals connected to a single endpoint in a matrix.

Elements described herein as "coupled" or "communicatively coupled" have an effectual relationship realizable by a direct or indirect connection with one or more other intervening elements.

Referring to FIG. 1, an exemplary terminal block 100 representative of the prior art is shown. The terminal block 100 comprises a plurality of terminals (such as terminal 102) The terminal 102 is exposed, allowing insertion of endpoint wires directly into screws 104A-B. However, if a user wishes to connect screw 104A (i.e., the endpoint connected at screw 104A) of terminal 102 to the screw (i.e., the endpoint connected to that screw) of another terminal, the user must manually loosen the screw 104A to remove the wire and insert it under the screw of the other terminal and tighten the screw. This process of unfastening the screws, replacing the wire, and refastening the screws is a time-consuming task that is error-prone, unsafe, exhausting for larger-scale projects, and inefficient in prototyping environments.

Terminal block 100 is a linear array of individually manipulable terminals. Disclosed is an apparatus which incorporates a plurality of interconnectable terminals in a multi-dimensional matrix.

Figure 2A:
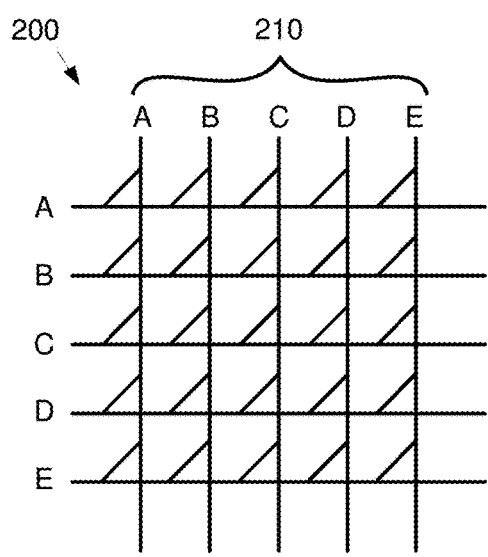
FIG. 2A shows a diagram illustrating the maximum number of endpoint connections in a matrix.

Referring to FIG. 2A, a diagram illustrating the maximum number of endpoint connections in a matrix 200 is shown. Given N endpoints (e.g., endpoints 210A-E as shown in FIG. 2A), the total number of endpoint interconnections is $N^2$ (25 endpoint interconnections as shown in FIG. 2A), i.e., the number of permutations of N. However, for the purpose of interconnecting endpoints, redundant combinations (e.g., A*B and B*A) and tautological combinations (e.g., A*A, B*B) add needless manufacturing costs and are frivolous.

Figure 2B:
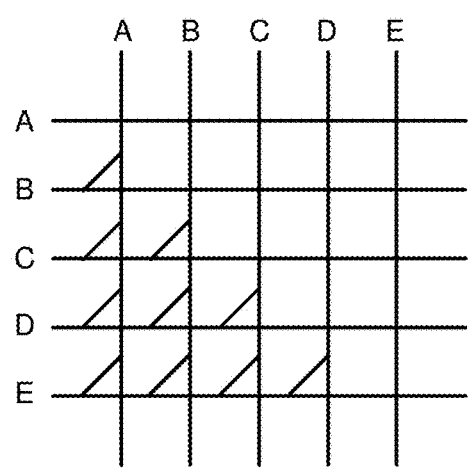
FIG. 2B shows a diagram illustrating unique endpoint connections in an optimally interconnectable matrix.

Referring to FIG. 2B, a diagram showing only unique endpoint connections in an optimally interconnectable matrix 250 is shown. The total number of unique endpoint connections between N endpoints is shown in Equation 1 above (e.g., 10 unique endpoint connections as shown in FIG. 2B). As shown in FIG. 2B, the unique endpoint connections (i.e., combinations) consist of A-B, A-C, A-D, A-E, B-C, B-D, B-E, C-D, C-E, and D-E.

Figure 3A:
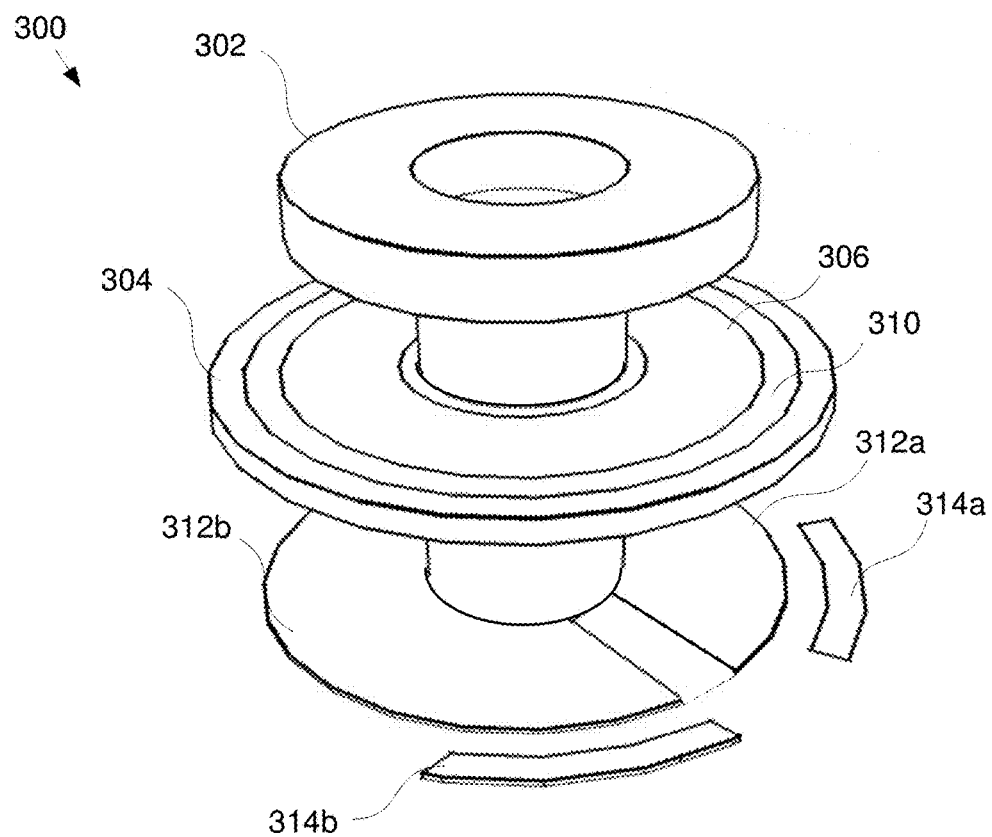
FIGS. 3A-B respectively show a perspective view and a top view of an exemplary terminal.
Figure 3B:
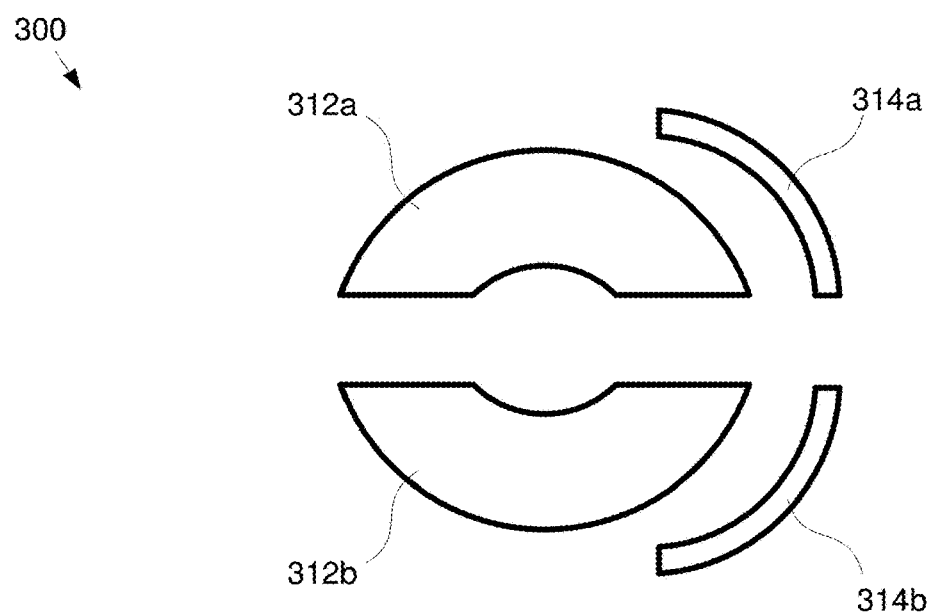

Referring to FIGS. 3A-B, a perspective view and a top view of an exemplary terminal 300 are shown respectively. In one embodiment, the terminal 300 comprises PCB trace contacts 312a-b corresponding to different endpoints (e.g., PCB trace contact 312a may correspond to endpoint 210A in FIG. 2A and PCB trace contact 312b may correspond to endpoint 210B in FIG. 2A). When PCB trace contact 312a and PCB trace contact 312b are shorted, their corresponding endpoints are connected. The terminal 300 also comprises circuit identification contacts 314a-b corresponding to the PCB trace contacts 312a-b.

The terminal 300 also comprises a shorting means that is used to short PCB trace contacts 312a-b and/or circuit identification contacts 314a-b. For example, the shorting means 302 may be a screw 302 to which a washer 304 may be coupled substantially beneath the head of the screw 302. The washer 304 may comprise an inner conducting portion 306 and an outer conducting portion 308 separated by an insulating portion 310. Although the shorting means is illustrated as a plunge-able screw 302 in FIG. 3A, the shorting means may utilize any method of shorting contacts, such as a pressure contact without the threads of a screw that can be engaged manually. Or the shorting means may involve soldering the PCB trace contacts 312a-b. The screw 302 may be a plastic screw or other non-conductive material.

Figure 4:
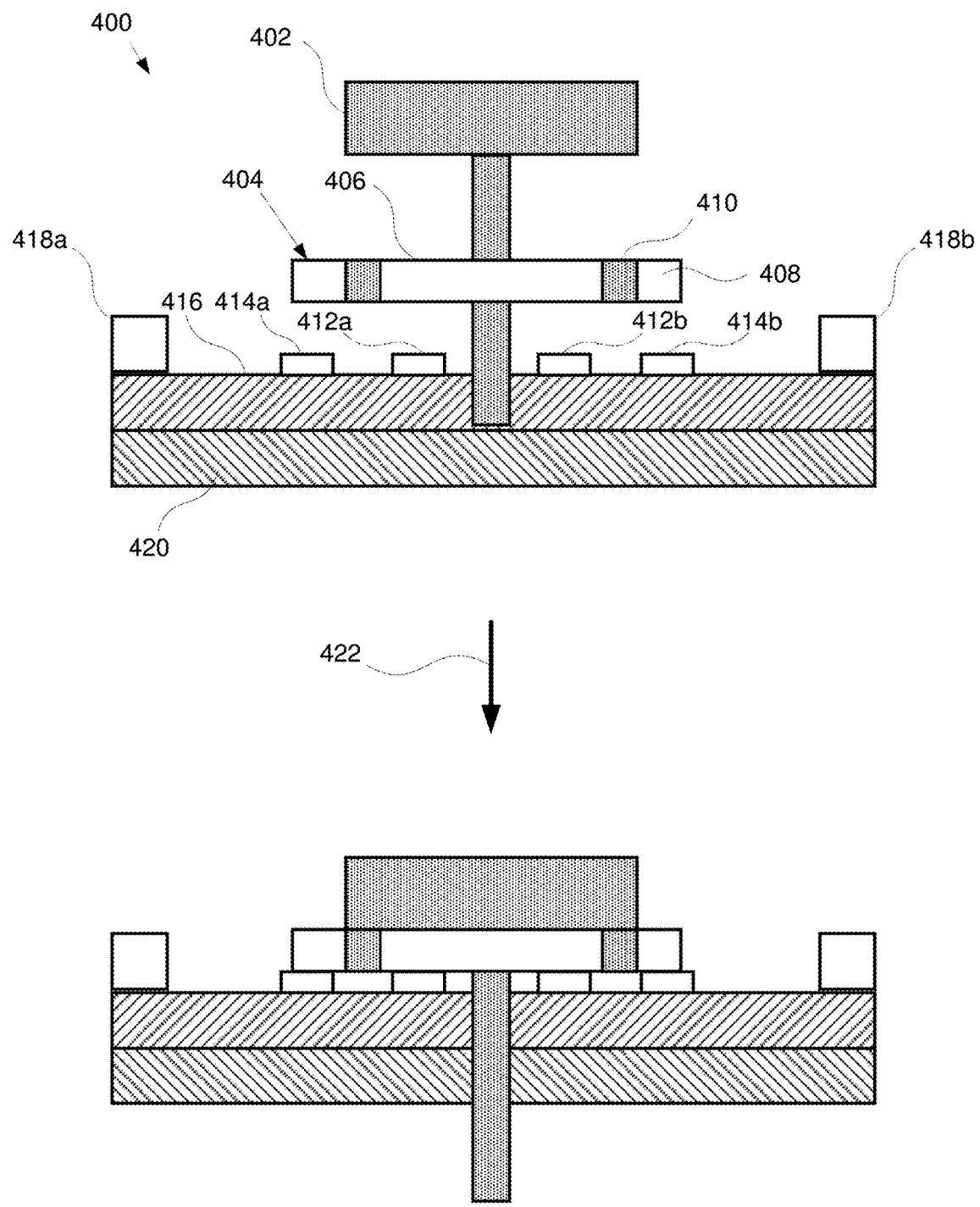
FIG. 4 shows a cross section of the exemplary terminal of FIG. 3A.

Reference is now made to FIG. 4, which shows a cross section of a terminal 400 (see FIG. 3A at 300). As shown, a PCB 416 may have the terminal 400 disposed on it. The PCB 416 may also have disposed on it a connector 418a and a connector 418b to which different endpoints may be coupled (not shown in FIG. 4). The connector 418a may be coupled to the PCB trace contact 412a through a trace of the PCB 416 (not shown in FIG. 4). The connector 418b may be coupled to the PCB trace contact 412b. Beneath the PCB 416 may be an insulating layer 420 to which the screw 402 may be rotatably fastened. The insulating layer 420 may be made of plastic or any other insulating material.

As shown in FIG. 4, when the screw 402 is fastened to the PCB 416 in a direction 422 toward the PCB 416, the inner conducting portion 406 of the washer 404 may short the contacts 412a and 412b. Simultaneously, the outer conducting portion 408 of the washer 404 may short the circuit identification contacts 414a and 414b.

The above mechanism illustrates one way in which the PCB trace contacts 412a-b and the circuit identification contacts 414a-b may be separately short-circuited at the same time. Other mechanisms may involve a solenoid-activated mechanism or a threaded screw. Alternately, the PCB trace contacts 412a-b and the circuit identification contacts 414a-b may be bare and may be short-circuited by applying solder.

Figure 5A:
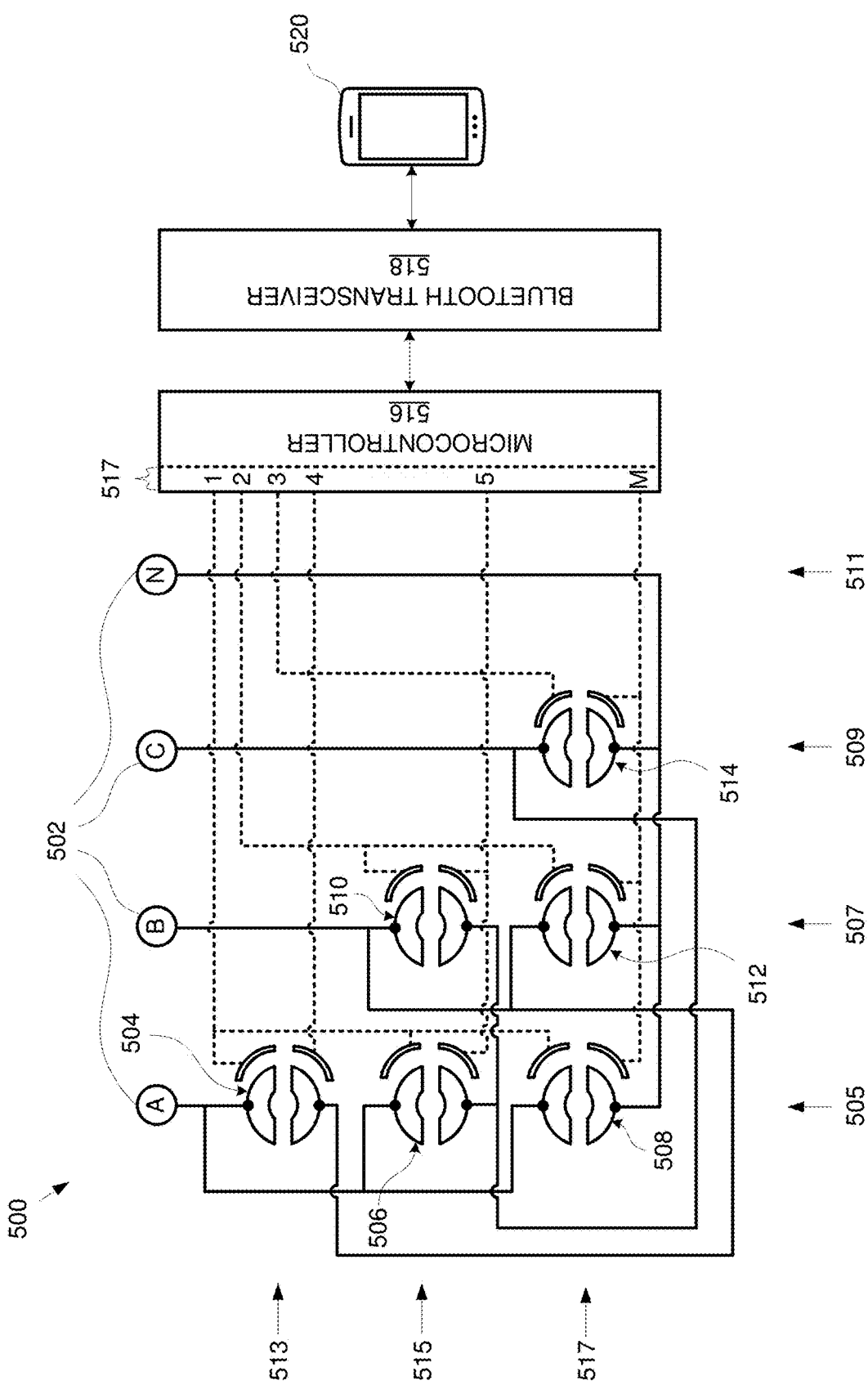
FIG. 5A shows a circuit diagram of an optimally interconnectable terminal matrix.

Referring to FIG. 5A, a circuit diagram of an optimally interconnectable terminal matrix 500 is shown. In one embodiment, the optimally interconnectable terminal matrix 500 may comprise a plurality of endpoints 502A-N. The optimally interconnectable terminal matrix 500 may also comprise a plurality of terminals 504-514 (see FIG. 3A-B at 300 and FIG. 4 at 400) each incorporating separate PCB trace contacts (see FIG. 3A-B at 312a-b and FIG. 4 at 312a-b), and circuit identification contacts (see FIG. 3A-B at 314a-b and FIG. 4 at 414a-b). The optimally interconnectable terminal matrix 500 may be expanded to interconnect N endpoints and may subsequently incorporate N(N−1)/2 terminals as shown in Equation 1 above. As shown in FIG. 5A, there are four endpoints and six terminals, each of the six terminals representing a unique pair of endpoints.

Since only pairs of endpoints are being interconnected in FIG. 5A, there are two sets of vectors. The first set (e.g., comprising vector 505, vector 507, vector 509, and vector 511) and is associated with N endpoints (e.g., endpoints 502A-N). The second set (e.g., comprising vector 513, vector 515, and vector 517) and is associated with N−1 endpoints (e.g., endpoints 502B-N). Each incremental vector in each set comprises one fewer terminal, which represents the removal of redundant or tautological combinations, i.e., the halving in Equation 1 above.

Each of the terminals 504-514 may be individually activated by fastening the shorting means thereof. For example, if terminal 504 is activated, endpoint 502A and endpoint 502B may be connected. For example, if terminal 506 is activated, endpoint 502A and endpoint 502C may be connected. For example, if terminal 508 is activated, endpoint 502A and endpoint 502N may be connected. For example, if terminal 510 is activated, endpoint 502B and endpoint 502C may be connected. For example, if terminal 512 is activated, endpoint 502B and endpoint 502N may be connected. For example, if terminal 514 is activated, endpoint 502C and endpoint 502N may be connected. Further terminals may be used to interconnect further endpoints, and are within the scope of the exemplary embodiments described herein.

In another embodiment, a terminal block incorporating an optimally interconnectable terminal matrix may only provide an ability to interconnect endpoints 502A-N. As such, the device may only comprise endpoints 502A-N and terminals 504-514 (i.e., without circuit identification contacts). With only these components, the device may at least provide the basic function of optimally interconnecting endpoints 502A-N in an efficient manner without the need to replace external wires.

In an additional embodiment, the optimally interconnectable terminal matrix 500 may comprise a microcontroller 516 which in turn may comprise a plurality of pins 517 (e.g., Pins 1-M), each of which is coupled to one of the two opposing circuit identification contacts of the terminals 504-514 as shown in FIG. 5A (see FIG. 3A-B at 314$a$-$b$ and FIG. 4 at 414$a$-$b$). In the same or additional embodiment, to identify the terminals that are engaged, the microcontroller 516 may be configured to output a voltage to a pin and detect a corresponding input in other pins to determine which of the terminals 504-514 (and subsequently which endpoints 502A-N) are shorted.

In some embodiments, the pins 517 may be split into a set of column pins (e.g., Pins 1-3) corresponding to the vectors 505-509 and a set of row pins (e.g., Pins 4-M) corresponding to the terminals in vectors 513-517. The number of pins is equal to 2(N−1) (where N is the number of endpoints 502A-N), which is equal to the sum of rows and columns (vectors) having at least one terminal.

The column pins may connect to the first circuit identification contacts of terminals 504-514, separated into columns according to the endpoints to which the first circuit identification contacts are connected. For example, the first circuit identification contacts of terminals 504-508 (i.e., the terminals of vector 505) are connected to endpoint 502A, the first circuit identification contacts of terminals 510-512 (i.e., the terminals of vector 507) are connected to endpoint 502B, and the first circuit identification contact of terminal 514 (i.e., the terminal of vector 509) is connected to endpoint 502C. Conversely, the row pins may be connected to the second circuit identification contacts of terminal 504-514, separated into rows according to the endpoints to which each column's endpoint is connected. For example, the second circuit identification contact of terminal 504 is connected to endpoint 502B, the second circuit identification contacts of terminals 506 and 510 are connected to endpoint 502C, and the second circuit identification contacts of terminals 508, 512, and 514 are connected to endpoint 502N.

The pins 517 and their connectivity to the endpoints 502A-N may be arranged in many different ways, not restricted to the embodiment described above and illustrated in FIGS. 5A-B. Thus, the embodiments described herein will be interpreted in an illustrative, not a restrictive sense.

In one embodiment, the microcontroller 516 may incorporate one or more processors and one or more memory modules. The one or more memory modules may store one or more instructions that when executed by the processor(s) cause the microcontroller to perform operations.

In one embodiment, the operations comprise a circuit identification process to detect which terminals are shorted (i.e., which endpoints are in a closed circuit). The circuit identification process involves detecting which terminals are shorted by applying a voltage to a first circuit identification contact of a terminal and detecting the voltage through the second circuit identification contact of that terminal. In one embodiment, this process is optimized by utilizing the arrangement of pins 517 described above. Essentially, a row pin would be provided a high voltage and each column pin would be scanned to determine whether the terminal at that row/column combination is shorted. The process would proceed with the rest of the row pins to scan all N(N−1)/2 terminals.

Up to $(N-1)^2$ steps may be needed to determine the status of all terminals. However, this process may be made more efficient by allowing multiple circuit identification processes to run in parallel by applying voltage to separate pins and scanning separate pins. Thus, each process scans through non-overlapping vectors. For example, a first process can apply voltage to vector 505 (through Pin 1) and scan for voltage in vector 513 (through Pin 4), while a further process can apply voltage to vector 507 (through Pin 2) and scan for voltage in vector 515 (through Pin 5). Yet another process may apply voltage to vector 509 (through Pin 3) and scan for voltage in vector 517 (through Pin M).

Figure 8:
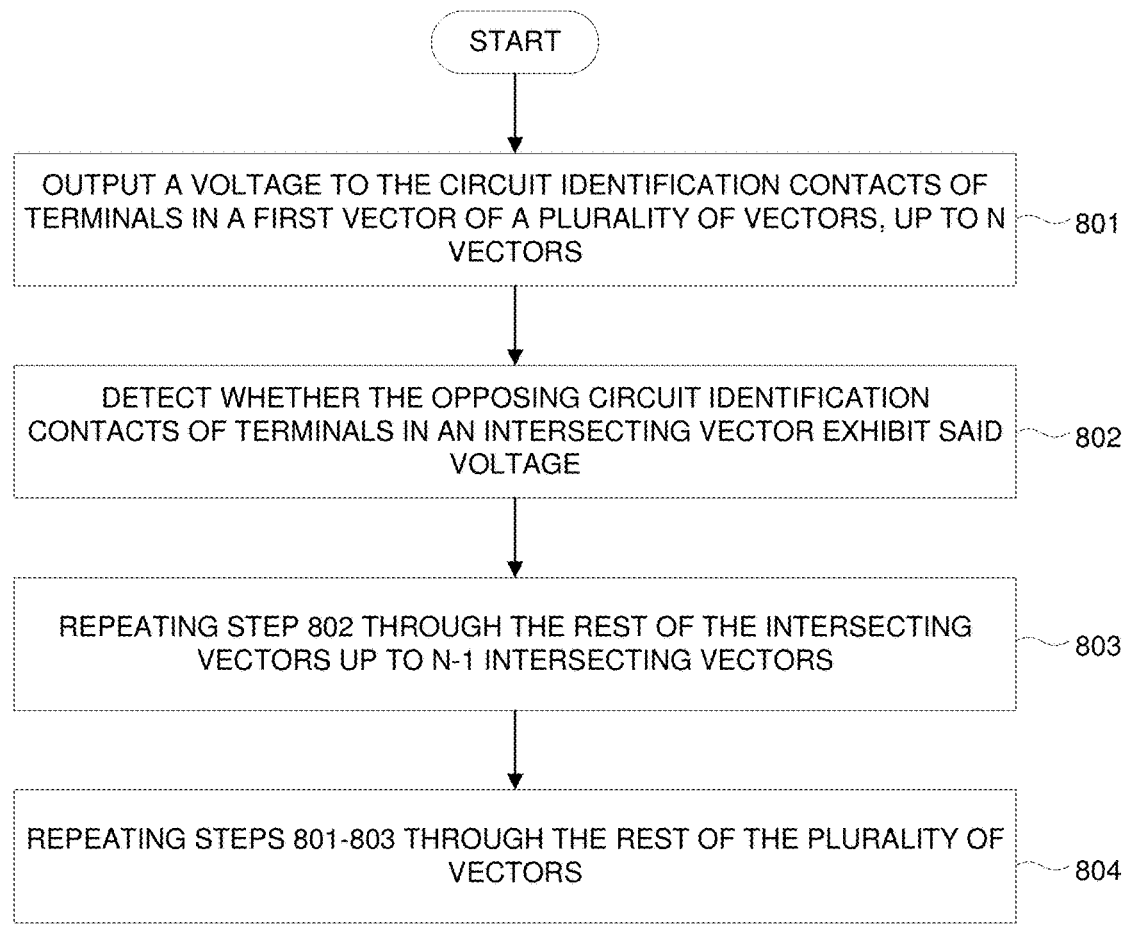
FIG. 8 shows an exemplary circuit identification process.

Referring to FIG. 8, a circuit identification process is shown. In step 801, the process involves outputting a voltage to the circuit identification contacts of terminals in a first vector of a plurality of vectors up to N vectors. In a step 802, the process involves detecting whether the opposing circuit identification contacts of terminals in an intersecting vector exhibit said voltage. In a step 803, the process involves repeating step 802 through the rest of the intersecting vectors up to N−1 intersecting vectors. In a step 804, the process involves repeating steps 801-803 through the rest of the plurality of vectors.

The process may be performed in any direction and by starting with, for example, any of the pins 517 of a set. For example, the step of outputting may start with Pin 3 and end with Pin 1 and the step of detecting performed for each step of outputting may start with Pin M and end with Pin 4. Or, the step of outputting may start with Pin 4 and end with Pin M and the step of detecting performed for each step of outputting may start with Pin 1 and end with Pin 3. As long as the steps of outputting and detecting are performed separately according to the first set of vectors and the second set of intersecting vectors, the process provides an optimal method of determining which endpoints are interconnected in the optimally interconnectable terminal matrix 500.

In another embodiment, the microcontroller 516 may be communicatively coupled to a Bluetooth® transceiver 518 which may allow pairing of the microcontroller 516 to a data processing device 520, such as a smartphone or a laptop computer. Pairing the microcontroller 516 to a data processing device 520 allows the microcontroller 516 to communicate to the data processing device 520 which of the terminals 504-514 are engaged. As such, a user of the optimally interconnectable terminal matrix 500 may be able to engage any of the terminals 504-514 and monitor which of the endpoints 502 are interconnected through, for example, an application stored in a memory of the data processing device 520 and executed by a processor of the data processing device 520.

In another embodiment, the Bluetooth® transceiver may rather be any wireless interface module capable of wired or wireless communications over any wireless area network (WAN) or personal area network (PAN). For example, the Bluetooth® transceiver may instead be a Wi-Fi™-enabled radio and may allow the microcontroller 516 to communicate which of the endpoints 502 is engaged to the data processing device 520 over Wi-Fi™. The Bluetooth® transceiver may utilize any type of Bluetooth® technology, including but not limited to Bluetooth Low Energy (BLE), Bluetooth 4.0, Bluetooth 5, or past/future iterations.

Figure 5B:
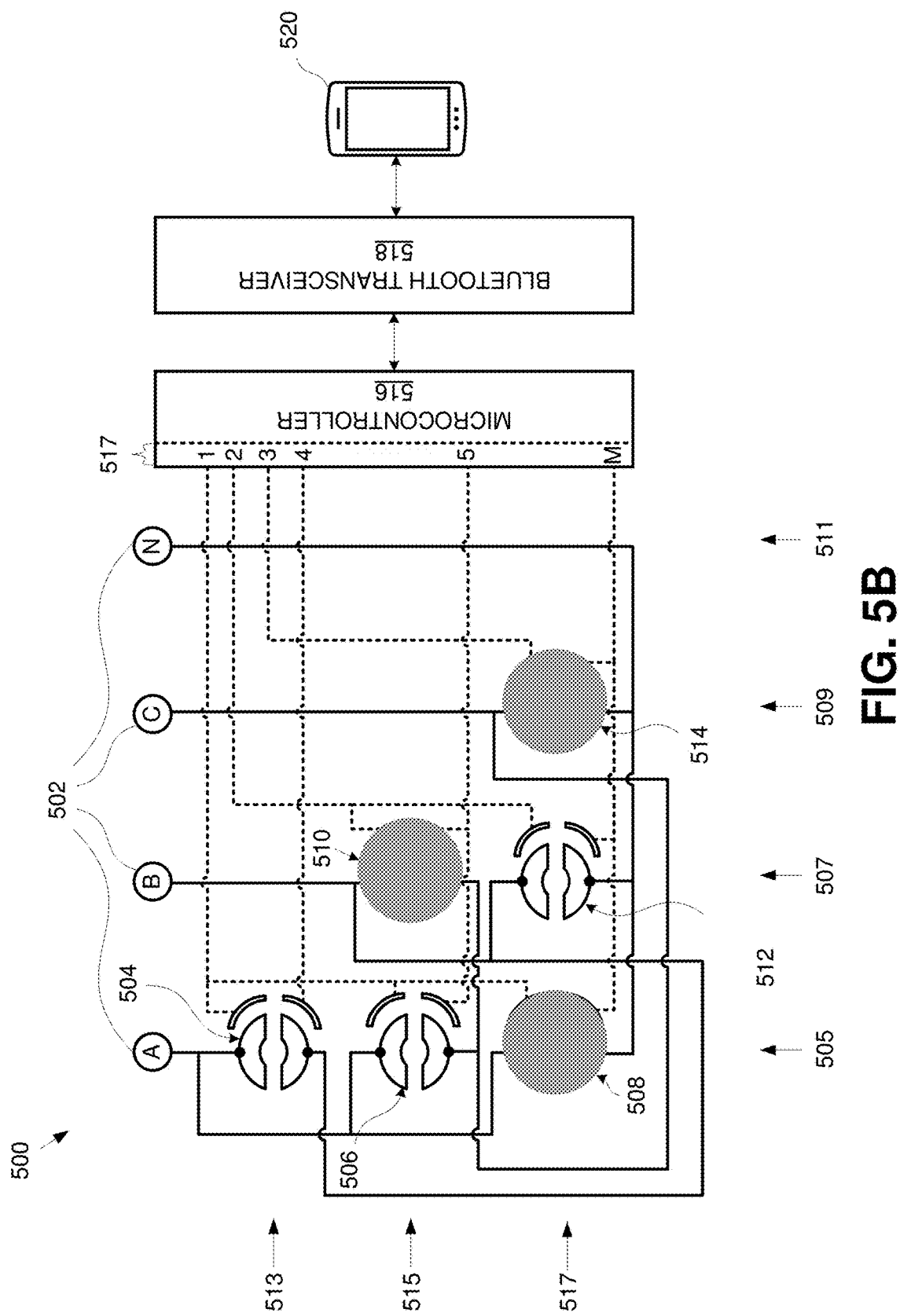
FIG. 5B shows the circuit diagram of FIG. 5A with particular terminals shorted.

Referring to FIG. 5B, the circuit diagram of FIG. 5A is shown with engaged terminals. In FIG. 5B, terminal 508, terminal 510, and terminal 514 are engaged. Alternately, any of the other terminals may be engaged. As such, FIG. 5B is meant to be interpreted as demonstrating one of many ways in which the endpoints may be interconnected and is intended to demonstrate one mode of operation of the optimally interconnectable terminal matrix 500.

In FIG. 5B, since terminal 508 is engaged, endpoint 502A and endpoint 502N are in a closed circuit. Since terminal 510 is engaged, endpoint 502B and endpoint 502C are in a closed circuit. Since terminal 514 is engaged, endpoint 502C and 502D are in a closed circuit.

As shown in FIG. 5B, terminal 508 is engaged. Thus, the circuit identification contacts associated with Pin 1 and Pin M will be shorted. As such, a voltage applied to Pin 1 will be detected in Pin M. Terminal 510 is also engaged. Thus, the circuit identification contacts associated with Pin 2 and Pin 5 will be shorted. As such, a voltage applied to Pin 2 will be detected in Pin 5. Terminal 514 is also engaged. Thus, the circuit identification contacts associated with Pin 3 and Pin M will be shorted. As such, a voltage applied to Pin 3 will be detected in Pin M.

During or subsequent to the above circuit identification process, the firmware or software of the microcontroller 516 may comprise further instructions to communicate all detected circuits to the data processing device 520 to be subsequently displayed through a display screen or through a series of LED indicators of the data processing device 520. Alternately, each of the endpoints 502A-N may be associated with LED indicators operable through the microcontroller 516. The LED indicators may allow a user of the optimally interconnectable terminal matrix 500 to identify which endpoints 502A-N have been interconnected through the engagement of any of the terminals 504-514. Other methods of identifying which circuits have been created and displaying the same are within the scope of the exemplary embodiments described herein.

Figure 6A:
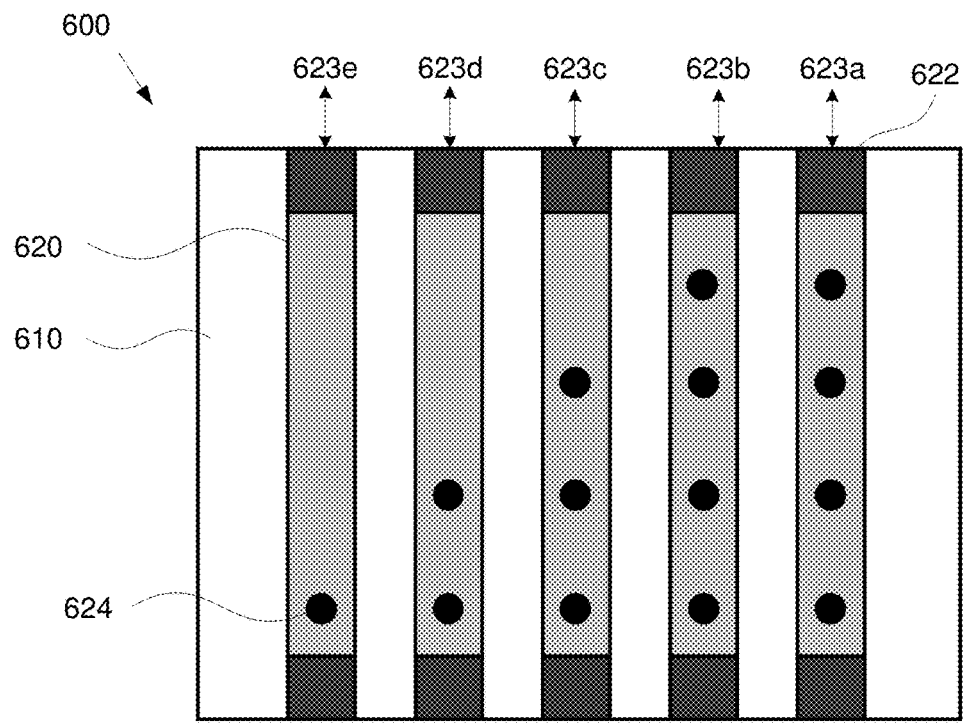
FIGS. 6A-B respectively show a first side and a second side of an exemplary PCB construction of an optimally interconnectable terminal matrix.
Figure 6B:
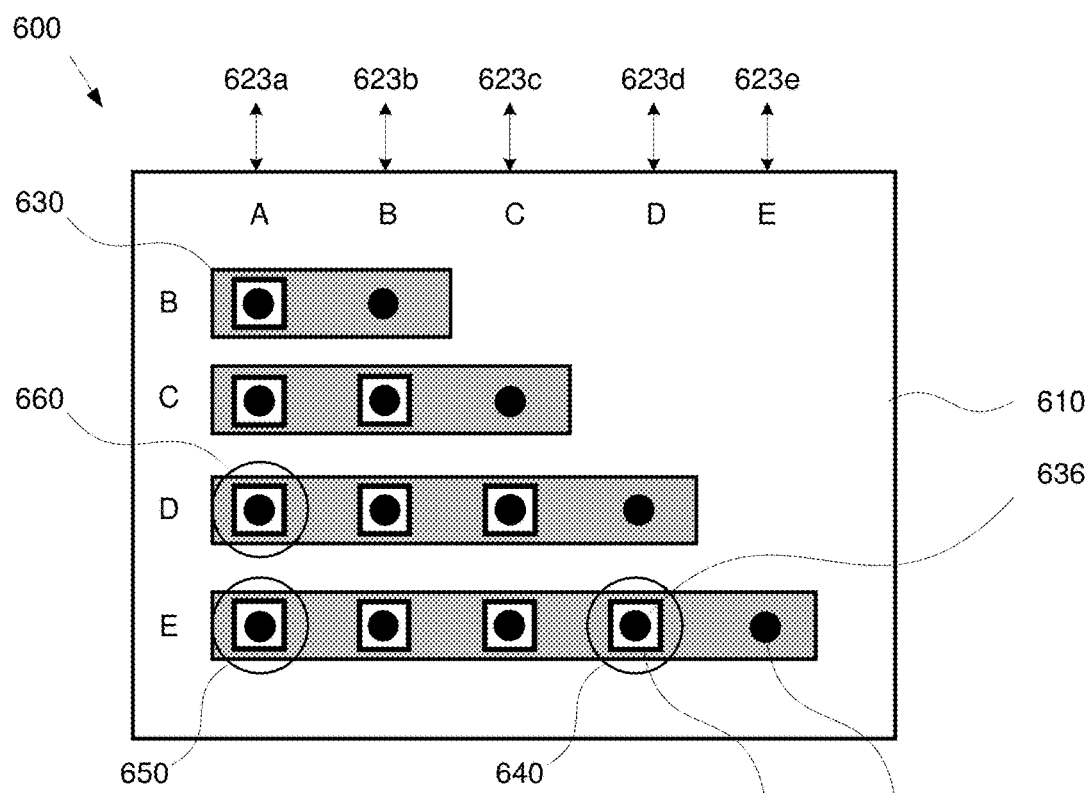

Referring to FIGS. 6A-B, a first side and a second side of an exemplary PCB construction 600 of an optimally interconnectable terminal matrix device are shown, respectively. In one embodiment, the optimally interconnectable terminal matrix device may comprise a PCB 610 or other substrate. As shown in FIG. 6A, the PCB 610 may comprise a plurality of conductive lanes 620 (e.g., corresponding to vectors 505-511 of FIGS. 5A-B), each conductive lane 620 comprising a connector 622 to which an endpoint 623 may be coupled. The number of conductive lanes 620 may be equal to the number of endpoints 623a-e connected to the connectors 622. Thus, the number of conductive lanes 620 is represented by 'N' in Equation 1 shown above.

The conductive lane 620 may be made of any conductive material, such as a PCB trace, for conducting electricity from the connector 622 to one or more nodes 624 and/or between the one or more nodes 624. In another embodiment, endpoints 623a-e may be connected to either ends of the conductive lanes 620 or directly to the corresponding nodes of those conductive lanes 620.

As shown in FIG. 6B, the second side of the PCB 610 may comprise a plurality of conductive lanes 630 (e.g., corresponding to vectors 513-517) perpendicular to the conductive lanes 620. The conductive lanes 630 may comprise naked nodes (e.g., naked node 634) and isolated nodes (e.g., isolated node 636) surrounded by contacts (e.g., contact 638). As such, the isolated node 636 and its contact 638 counterpart may constitute a terminal 640 in the optimally interconnectable terminal matrix 600 illustrated in FIGS. 6A-B. The naked node may connect the conductive lanes 620 to individual conductive lanes 630.

The conductive lanes 630 may also be made of conductive material, or at least comprise a means for conducting electricity between naked nodes and contacts present in the conductive lanes 630. Note that the number of conductive lanes 630 is equal to the number of endpoints minus one. This represents '(N−1)' in Equation 1 shown above. Each of the conductive lanes 630 may be labeled with the endpoint corresponding to the naked node in that lane. This aids the user in determining which endpoints pairings are interconnected.

Shorting the terminal 640 through any reasonable means (such as a conductive washer (see FIG. 3A at 310), a screw, a plunger, solder or other means) causes the naked node 634, the isolated node 636 and the contact 640 surrounding the isolated node 636 to be connected. For example, shorting the terminal 640 causes the naked node 634 (connected to endpoint 623e through the leftmost conductive lane 620 at 624 as shown in FIG. 6A) to be connected to the isolated node 636 (connected to endpoint 623d through the second to the leftmost conductive lane 620 as shown in FIG. 6A) through contact 638.

If the user desires to connect endpoints 623e and 623d to further endpoints, such as an endpoint 623c, endpoint 623b, or endpoint 623a, the user may short the isolated node and surrounding contact corresponding with those endpoints. For example, if the user desires to further interconnect endpoint 623a to endpoint 623d and endpoint 623e, the user may engage a terminal 650 (i.e., to connect endpoint 623a to endpoint 623e). Alternately, to achieve the same purpose, the user may short terminal 660 (i.e., to connect endpoint 623a to endpoint 623d).

It will be appreciated by a person of ordinary skill in the art of interconnection terminal matrix devices that different PCB arrangements, PCB components, sizes/shapes of components, and form factors may be used to achieve the same purpose as the embodiments described herein. Thus, all such variations are within the scope of the present disclosure.

Figure 7:
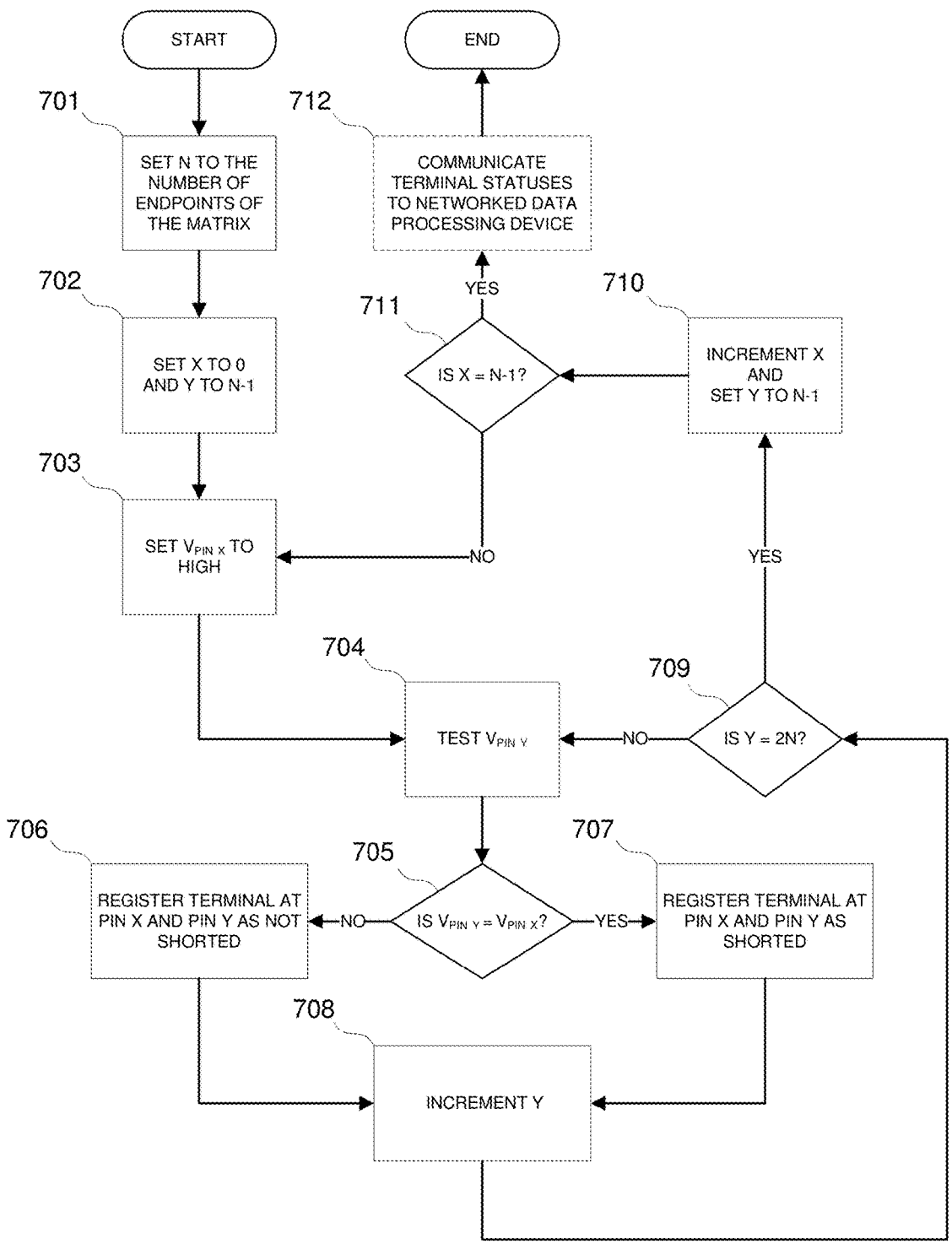
FIG. 7 shows an exemplary decision flow chart of an exemplary circuit identification process.

Referring to FIG. 7, an exemplary decision flow chart of an exemplary circuit identification process is illustrated. At a first step 701, microcontroller creates a variable N which is made equal to the number of endpoints of the optimally interconnectable terminal matrix. The process proceeds to step 702, in which the microcontroller creates a variable X and sets it to 0 and creates a variable Y and sets it to N−1. Pin 0 to Pin N−1 may correspond to a first set of vectors and Pin N to Pin 2N−1 may correspond to a second set of vectors intersecting the first set of vectors. The process proceeds to step 703, in which the voltage of Pin X is set to a high voltage (e.g., 1V). The process proceeds to step 704, in which the voltage of Pin Y is tested. The process proceeds to decision 705, which determines whether the voltage of Pin X and Pin Y are equal. If no, the process proceeds to step 706, in which the terminal at Pin X and Pin Y is determined to be not shorted. If yes (e.g., $V_{Pin\_y}=1V$), the process proceeds to step 707, in which the terminal at Pin X and Pin Y is determined to be shorted.

In any case, the process proceeds to step 708, in which the variable Y is incremented. The process proceeds to decision 709, which determines whether variable Y is equal to 2N. If no, the process returns to step 704. If yes, the process proceeds to step 710, in which variable X is incremented and variable Y is reset to N−1. The incrementing at step 708 allows the process to iterate through the second set of intersecting vectors whereas the incrementing at step 710 allows the process to iterate through the first set of vectors as described in the above circuit identification process.

The process proceeds to decision 711, which determines whether variable X is equal to N−1. If no, the process returns to step 703 to begin iterating through the new vector. If yes, the process proceeds to optional step 712, in which the microcontroller communicates the status of one or more of the terminals to a networked data processing device.

Although the present embodiments have been described with reference to specific example embodiments, it will be evident that various modifications and changes may be made to these embodiments without departing from the broader spirit and scope of the various embodiments. It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

The various devices and modules described herein may be enabled and operated using hardware circuitry (e.g., CMOS based logic circuitry), firmware, software or any combination of hardware, firmware, and software (e.g., embodied in a non-transitory machine-readable medium). For example, the various electrical structure and methods may be embodied using transistors, logic gates, and electrical circuits (e.g., application specific integrated (ASIC) circuitry and/or Digital Signal Processor (DSP) circuitry)

A number of embodiments have been described. Nevertheless, it will be understood that various modifications may be made without departing from the spirit and scope of the claimed invention. In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

It may be appreciated that the various systems, methods, and apparatus disclosed herein may be embodied in a machine-readable medium and/or a machine accessible medium compatible with a data processing system (e.g., a computer system), and/or may be performed in any order.

The structures and modules in the figures may be shown as distinct and communicating with only a few specific structures and not others. The structures may be merged with each other, may perform overlapping functions, and may communicate with other structures not shown to be connected in the figures. Accordingly, the specification and/or drawings may be regarded in an illustrative rather than a restrictive sense.

The invention claimed is:

1. A terminal apparatus for optimally interconnecting a plurality of N endpoints, comprising: a substrate comprising an optimized matrix of one or more terminals, the number of terminals being at least the number required to short one or more unique pairs of the N endpoints, wherein the terminals each comprise a first contact coupled to a first endpoint of the N endpoints and a second contact coupled to a second endpoint of the N endpoints, wherein when the first contact and the second contact are shorted, the first endpoint and the second endpoint are connected, wherein a set of N conductive lanes is disposed on the substrate transverse to another set of N conductive lanes also disposed on the substrate such that each overlap between the N conductive lanes and the another set of N conductive lanes comprises an isolated node that, when shorted, causes the respective lane from the set of N conductive lanes and the respective lane from the another set of N conductive lanes to be connected, wherein each N conductive lane is associated with a unique endpoint of the N endpoints.

2. The apparatus of claim 1, wherein the terminals of the optimized matrix are disposed on one or more sides of the substrate.

3. The apparatus of claim 1, wherein the number of terminals is equal to $((N)(N-1))/2$.

* * * * *